United States Patent
DiCamillo et al.

(10) Patent No.: US 6,782,248 B2
(45) Date of Patent: Aug. 24, 2004

(54) FREQUENCY SCALABLE, LOW SELF-GENERATED NOISE FREQUENCY SOURCE

(75) Inventors: Nicholas F. DiCamillo, Torrance, CA (US); Allen W. Paxton, Gardena, CA (US); Daniel R. Franzen, Hermosa Beach, CA (US); Mark Kintis, Manhattan Beach, CA (US); Daniel R. Lane, Santa Monica, CA (US); Bridget M. Martin, Torrance, CA (US); Dale W. Mooney, Torrance, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 451 days.

(21) Appl. No.: 10/044,149

(22) Filed: Jan. 11, 2002

(65) Prior Publication Data

US 2003/0134610 A1 Jul. 17, 2003

(51) Int. Cl.[7] .............................................. H04B 7/185
(52) U.S. Cl. ...................... 455/318; 455/259; 455/13.1
(58) Field of Search ................................ 455/258, 259, 455/20, 22, 183.1, 314, 315, 76, 12.1, 13.1, 13.2, 318; 370/315, 316; 375/214, 215

(56) References Cited

U.S. PATENT DOCUMENTS

| | | | |
|---|---|---|---|
| 6,211,835 B1 | 4/2001 | Peebles et al. | |
| 6,215,452 B1 | 4/2001 | Chandler et al. | |
| 6,233,433 B1 | 5/2001 | Norin | |
| 6,236,375 B1 | 5/2001 | Chandler et al. | |
| 6,438,354 B2 * | 8/2002 | Thompson et al. | 455/12.1 |
| 6,571,081 B1 * | 5/2003 | Reinhardt | 455/12.1 |
| 6,628,919 B1 * | 9/2003 | Curello et al. | 455/12.1 |
| 6,654,357 B1 * | 11/2003 | Wiedeman | 370/315 |

* cited by examiner

*Primary Examiner*—Edward F. Urban
*Assistant Examiner*—Blane J. Jackson (57) ABSTRACT

A frequency scalable, low self-generated noise frequency source generates coherent or mostly-coherent local oscillator signals and includes a common reference, a coherent set of high frequency references and specific local oscillators which may be non-coherent for each specific output frequency. Delay lines may be included in the paths to ensure time delay alignment. The use of these elements with this modular design allows the generation of multiple coherent local oscillators via replication of the modular design elements.

47 Claims, 3 Drawing Sheets

FREQUENCY SCALABLE, LOW SELF-GENERATED NOISE FREQUENCY SOURCE

BACKGROUND OF THE INVENTION

1. Field of the Invention

The present invention relates to the generation of multiple frequencies and more particularly, the present invention relates to a frequency scalable, low self-generated noise frequency source.

2. Description of the Related Art

In a typical communications channel, the phase noise is introduced on the desired signal being received or transmitted. This phase noise degrades the overall signal to noise ratio (SNR), thereby leading to degraded signal acquisition or bit error rate performance. Typically, phase noise is introduced when the signal is multiplied by a local oscillator (LO) signal in a frequency conversion stage, the LO signal being the main source of the phase noise. Multiple frequency conversions in a communications channel and corresponding multiple LO signals may result in significant SNR degradation due to phase noise.

BRIEF SUMMARY OF THE INVENTION

The object of the present invention is to provide a frequency scalable, low self-generated noise frequency source having a modular architecture for generating coherent or mostly-coherent local oscillator signals. The frequency source in accordance with the present invention includes a common reference, a coherent common set of high frequency references and specific local oscillators which may be non-coherent for each specific output frequency. Delay lines may be included in the paths to ensure time delay alignment at the payload level. The use of these elements maximizes design reuse since just the specific IF local oscillators and delays and specific filters need custom design.

A frequency source in accordance with the present invention may include the following elements:

- a modular design allowing the generation of multiple coherent local oscillators via replication of the modular design elements;
- the use of a common low-frequency reference for all local oscillators;
- the generation of a set of higher frequency tones as high frequency reference signals, most economically, via the transfer of an intermediate reference signal to all modules and the local generation of the set of higher frequency reference tones, the set of high frequency reference signals generally being evenly spaced in frequency;
- the incorporation of delay elements to time-match all local oscillators;
- the generation in each module of an intermediate frequency specific local oscillator signal which is based on the reference but is not fully coherent with respect to the high frequency reference tones;
- the generation in each module of the final local oscillator signal by mixing the coherent high-frequency reference signal with the specific IF local oscillator signal, the mixing being either high-side or low-side mixing.

BRIEF DESCRIPTION OF THE DRAWINGS

The foregoing and a better understanding of the present invention will become apparent from the following detailed description of example embodiments and the claims when read in connection with the accompanying drawings, all forming a part of the disclosure of this invention. While the foregoing and following written and illustrated disclosure focuses on disclosing example embodiments of the invention, it should be clearly understood that the same is by way of illustration and example only and that the invention is not limited thereto. The spirit and scope of the present invention are limited only by the terms of the appended claims.

The following represents brief descriptions of the drawings, wherein.

DETAILED DESCRIPTION OF THE INVENTION

Before beginning a detailed description of the subject invention, mention of the following is in order. When appropriate, like reference numerals and characters may be used to designate identical, corresponding or similar components in differing drawing figures. Furthermore, in the detailed description to follow, example sizes/models/values/ranges may be given, although the present invention is not limited thereto. Arrangements may be shown in block diagram form in order to avoid obscuring the invention and also in view of the fact that specifics with respect to implementation of such block diagram arrangements are highly dependent upon the platform within which the present invention is to be implemented, that is, such specifics should be well within the purview of one skilled in the art.

Before describing details of embodiments of the present invention, a brief overview of a satellite payload will be provided. The satellite payload to be described is capable of receiving high frequency uplink beams at a plurality of receive antennas, converting the higher frequency to a lower frequency for switching and filtering of channels, converting the lower frequency signals to a higher frequency, and distributing the high power signals to one of the plurality of transmit antennas.

Figure 1:
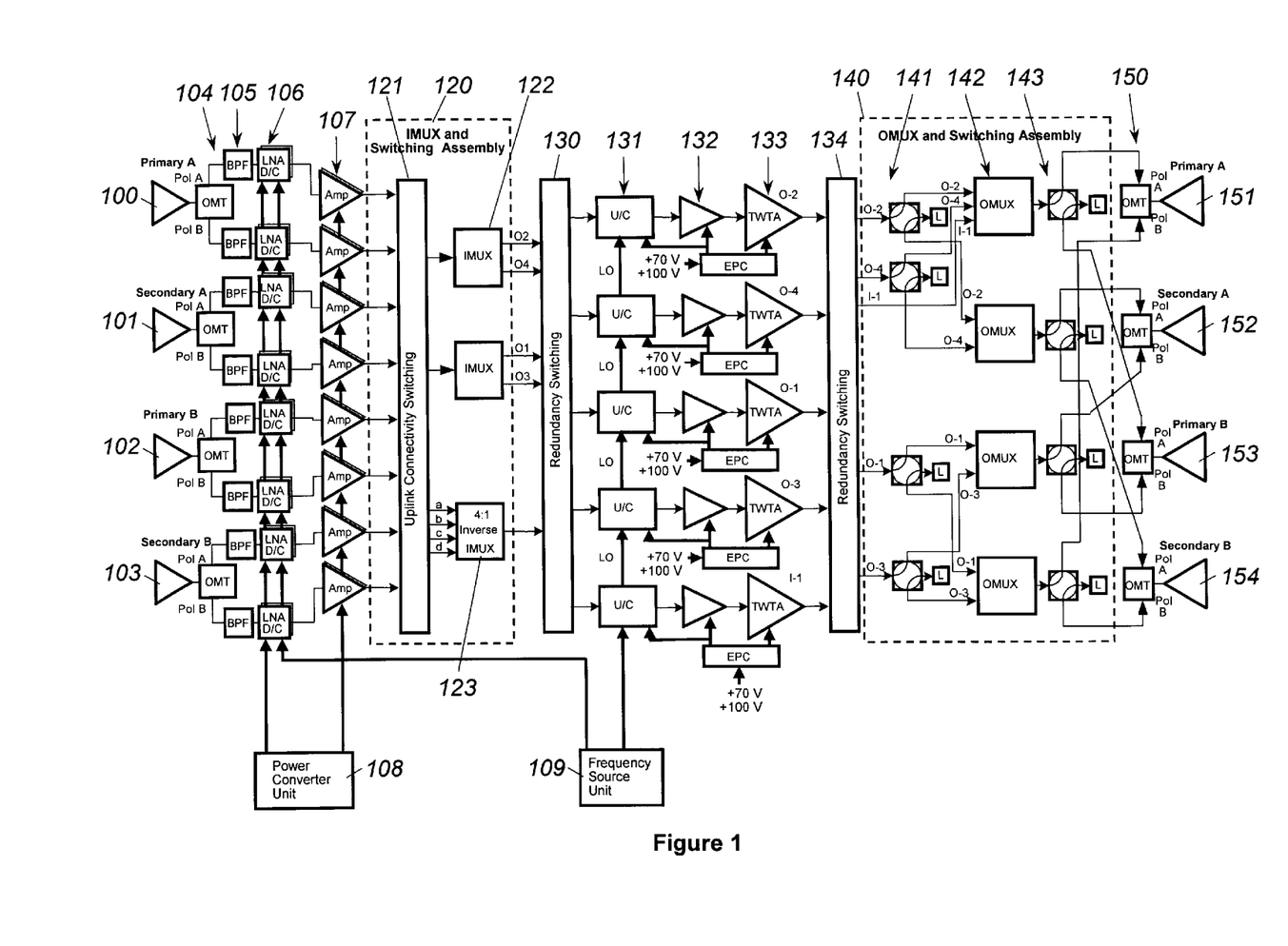
FIG. 1 is a block diagram of exemplary payload circuitry of a satellite which may include the preferred embodiments of the present invention.

FIG. 1 illustrates electronics in a payload for a multi-beam satellite according to an example embodiment of the present invention. Other embodiments and configurations are also within the scope of the present invention. As one example, the satellite may be a communications satellite for use with broadband communications such as for the Internet. The satellite may include numerous antenna structures such as disclosed in U.S. Pat. No. 6,236,375, the subject matter of which is incorporated herein by reference. Each antenna may be an offset Cassegrain antenna having a subreflector, a main reflector and a separate feed array. FIG. 1 illustrates the electronics in the payload for one beam group of a satellite. The satellite payload may include similar electronics for each of the other beam groups. As one example, the satellite may include antenna structures for receiving and transmitting numerous beam groups, for example, eight beam groups.

FIG. 1 shows a first dual-polarization antenna 100, a second dual-polarization antenna 101, a third dual-polarization antenna 102 and a fourth dual-phase antenna 103 each to receive uplink beams from Earth in a well-known manner. Upon receipt of the uplink signals (such as broadband communication signals) at an antenna, the received signals may pass through an ortho-mode transducer (OMT) 104 to a band pass filter (BPF) 105. The filtered signals may pass to a low noise amplifier downconverter (LNA D/C) 106 that converts the received signal from a higher frequency (such as approximately 30 GHz) to a lower frequency (such as approximately 4 or 5 GHz).

The lower frequency communications signals may then be amplified by an amplifier 107 and proceed to an input multiplexer (IMUX) and switching assembly 120. The IMUX and switching assembly 120 may include an uplink connectivity switching network 121, which may be a power dividing switching network. Signals output from the uplink connectivity switching network 121 may be input to either one of the two outbound multiplexers (IMUX) 122 or to the 4:1 inverse IMUX 123. The IMUXes 122 output signals along forward channels O1, O2, O3 and O4 to a redundancy switching network 130. The 4:1 inverse IMUX 123 outputs signal along return channel 11 to the redundancy switching network 130.

The redundancy switching network 130 outputs signals to the up converters (U/C) 131. The U/Cs 131 convert the lower frequency signals to higher frequency signals (such as approximately 20 GHz) that will be used for transmission back to the Earth. The higher frequency signals may then pass through channel linearizer/amplifiers 132 and TWTAs 133. The TWTAs 133 are high power amplifiers that supply the transmit RF power to achieve the downlink transmission. The TWTAs 133 output high power outbound signals O-1, O-2, O-3, O-4 and inbound signal I-1 to the redundancy switching network 134. The redundancy switching network 134 provides the signals I-1, O-1, O-2, O-3 and O-4 to an output multiplexer (OMUX) and switching assembly 140.

The OMUX and switching assembly 140 may include mechanical switches 141 that couple the signals I-1, O-1, O-2, O-3 and O-4 to multiplexers (OMUX) 142. The signals pass through the OMUXes 142 and are appropriately distributed to mechanical switches 143. The switches 143 distribute the signals to one of the downlink OMTs 150 and the corresponding downlink antenna such as a first dual-polarization downlink antenna 151, a second dual-polarization downlink antenna 152, a third dual-polarization downlink antenna 153 and a fourth dual-polarization downlink antenna 154.

A power converter unit 108 may also be provided to supply DC power to the LNA D/Cs 106 and the amplifiers 107. Additionally, a frequency source unit 109, which may correspond to the present invention, may supply a local oscillator (LO) signal to the LNA D/Cs 107 and to the U/Cs 131.

Figure 2:
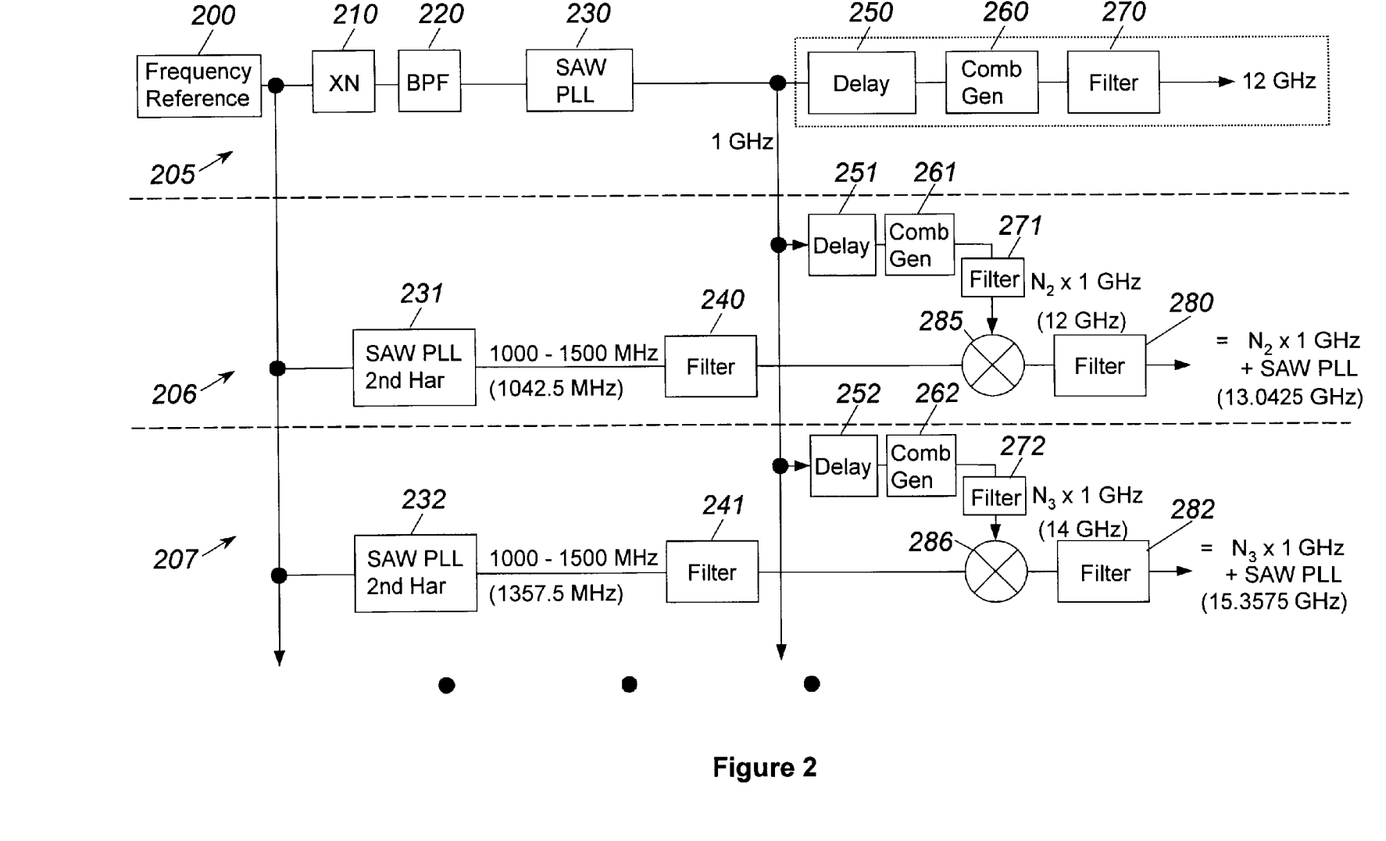
FIG. 2 illustrates a frequency source arrangement in accordance with a first embodiment of the present invention.

FIG. 2 illustrates a frequency source arrangement in accordance with a first embodiment of the present invention. As illustrated in FIG. 2, three LO (local oscillator) channels 205, 206, and 207 are shown. However, the present invention is not limited to this number of channels but rather, any combination and number of LO channels may be provided, depending upon the number of LO frequencies to be supplied.

A frequency reference 200 supplies a reference frequency for all of the channels. Channel 205 is a channel for generating a frequency which is an integer multiple of the reference frequency. For example, the reference frequency may be 10 MHz. The output of the frequency reference 200 is inputted to a multiplier 210 where it is multiplied in frequency by a factor N, where N is an integer. The output of the multiplier 210 is inputted to a bandpass filter 220 to eliminate spurious frequencies generated by the multiplier 210. The output of the bandpass filter 220 is inputted to a PLL (Phase Locked Loop) 230. While an SAW (Surface Acoustic Wave) PLL is shown in FIG. 2, it is of course understood that the present invention is not limited thereto but rather any suitable PLL may be used.

The PLL 230 produces an output signal which bears a relationship to the signal outputted by the bandpass filter 220. This relationship along with the value of the multiplication factor N are selected so as to produce a signal output of the PLL 230 of the desired frequency. For example, the relationship and the multiplication factor N may be selected to produce an output frequency of 1 GHz. It is to be noted that the multiplier 210, bandpass filter 220, and PLL 230 may be omitted if the frequency of the frequency 200 is increased.

The output of the PLL 230 is used to drive a delay element 250 as well as driving the delay elements in the other channels. The delay element 250 is used to add a predetermined time delay to the signal inputted thereto.

The output of the delay element is inputted to a comb generator 260 to produce a multitude of harmonic signals stepped-up in frequency from the signal inputted thereto. The output of the comb generator 260 is inputted to a filter 270 where a desired one of the multitude of signals generated by the comb generator 260 is selected. For example, in this case, an output signal of 12 GHz has been selected.

Channels 206 and 207, which have essentially the same elements, are used to generate output signals which are not integral multiples of the reference frequency. Delay elements 251 and 252 may be similar to or identical to delay element 250 but are designed to produce predetermined time delays which may differ for each channel.

Similarly, comb generators 261 and 262 may be similar to or identical to comb generator 260 and filters 271 and 272 may also be similar to or identical to filter 270 but are designed to produce selected frequencies, 12 GHz, for example, in the case of filter 271 and 14 GHz, for example, in the case of filter 272. The outputs of filters 271 and 272 are respectively inputted to mixers 285 and 286.

The output of frequency reference 200 is inputted to both PLL 231 of channel 206 and PLL 232 of channel 207. PLL 231 and PLL 232 are illustrated as being second harmonic SAW PLL's but it is to be understood that the present invention is not limited thereto. These two PLL's may be designed to produce specific respective frequencies bearing predetermined relationships to the output of frequency reference 200. For example, PLL 231 may be designed to produce an output signal in the range of from 1000 to 1500 MHz and more specifically 1042.5 MHz, for example. Similarly, PLL 232 may also be design to produce an output signal in the range of from 1000 to 1500 MHz and more specifically 1357.5 MHz, for example.

The outputs of PLL 231 and PLL 232 are respectively inputted to filters 240 and 241 to eliminate spurious signals. The outputs of filters 240 and 241 are respectively inputted to mixers 285 and 286. The outputs of filters 271 and 272 are respectively inputted to the inputs of mixers 285 and 286.

The outputs of mixers 285 and 286 are respectively inputted to filters 280 and 282 to select the suitable output signals, a signal of frequency 12 GHz plus 1042.5 MHz, for example, in the case of filter 280 and a signal of frequency 14 GHz plus 1357.5 MHz in a case of filter 282. Note that each mixer produces an output signal having a frequency equal to the sum of the frequencies of the signals inputted thereto and an output signal having a frequency equal to the difference of the frequencies of the signals inputted thereto. The respective filter connected to the output of each mixer chooses either the sum or difference output signal of the mixer. While the sum has been chosen in this example, it is to be understood that the present invention is not limited thereto and the difference signal can just as easily have been chosen.

Figure 3:
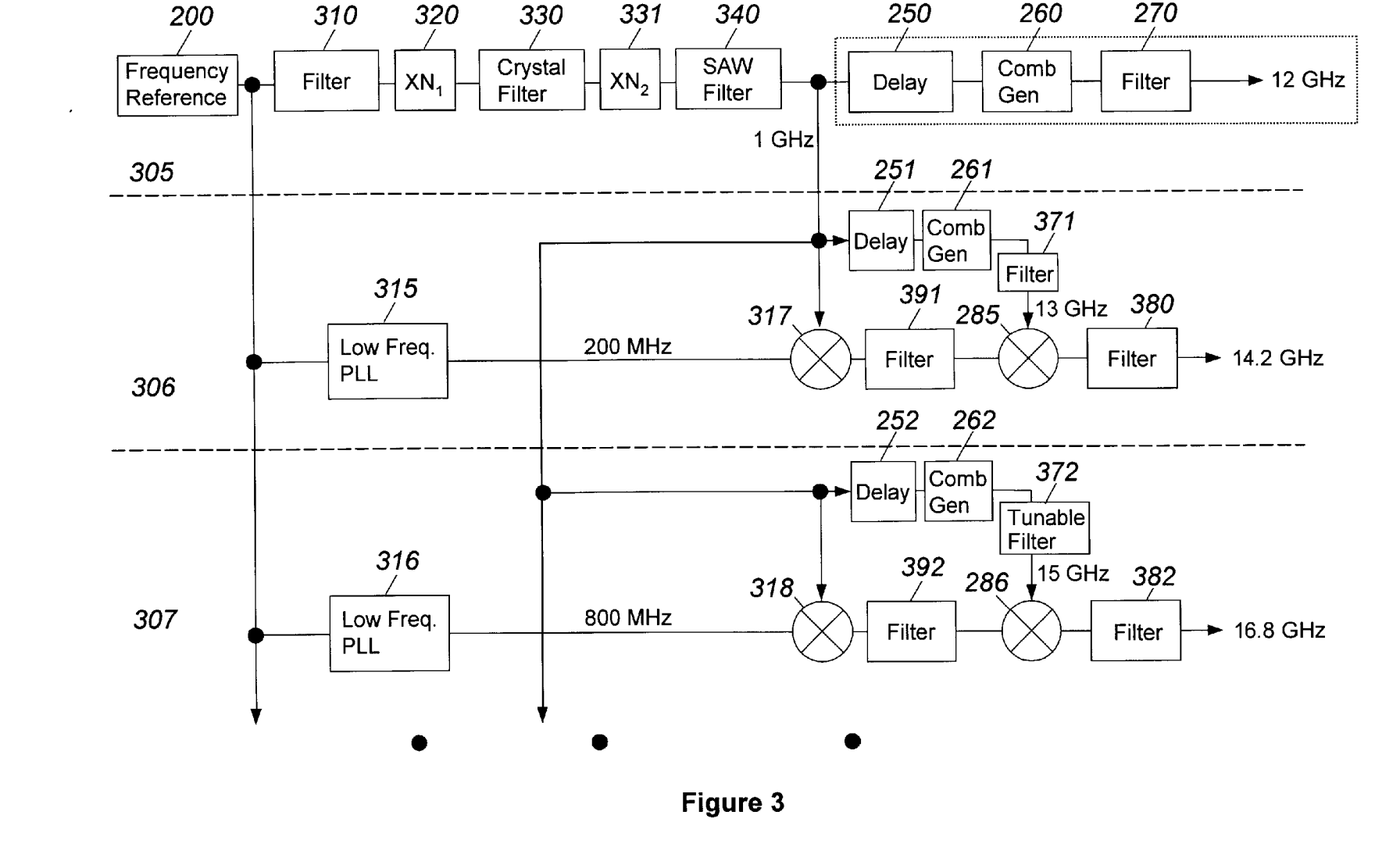
FIG. 3 illustrates a frequency source arrangement in accordance with a second embodiment of the present invention.

FIG. 3 illustrates a frequency source arrangement in accordance with a second embodiment of the present invention. FIG. 3 differs from FIG. 2 in that lower frequency PLLs, for example, operating below 1 GHz, are used. As illustrated in FIG. 3, frequency reference 200 provides a reference frequency which is inputted to filter 310 of channel 305 and to low-frequency PLLs 315 and 316.

Filter 310 filters out spurious signals and provides an output to frequency multiplier 320 where the frequency is multiplied by the multiplication factor N1, where N1 is an integer. The output of the frequency multiplier 320 is fed to another filter 330, which may be a crystal filter, which eliminates various spurious frequency signals. The output thereof is inputted to a second frequency multiplier 331 where the frequency is multiplied by the multiplication factor N2, where N2 is an integer. The output of the second frequency multiplier 331 is inputted to a filter (which may be a SAW filter) 340 to produce an output signal which is inputted to delay elements 250, 251, and 252 and to mixers 317 and 318. As with elements 210, 220, and 230 of FIG. 2, one or more of the multipliers 320 and 331 and one or more of the filters 310, 330, and 340 may be eliminated if the frequency of the frequency reference 200 is increased.

In channel 305, elements 250, 260, and 270 correspond to the same elements in FIG. 2 and produce the same output signal as in FIG. 2, in this case, 12 GHz, for example.

In channel 306, the low-frequency PLL 315 produces a signal bearing a relationship to the signal input thereto, for example, a signal having a frequency of 200 MHz. This signal, when mixed in mixer 317 with the signal output of the SAW filter 340, results in a signal outputted by the mixer 317 whose frequency is the sum of the frequencies of the two input signals, namely, 1.2 GHz as well as a signal whose frequency is the difference of the frequencies of the two input signals.

The signal outputted by the mixer 317 is filtered by the filter 391 to remove one of the two output frequency components, for example, the difference frequency component is removed, and the output of the filter 391 is inputted to another mixer 285. Delay element 251 and comb generator 261 correspond to the same elements in FIG. 2 and produce the same output signal as in FIG. 2. The output of the comb generator 261 is inputted to a filter 371 which extracts the appropriate harmonic generated by the comb generator 261, a signal having a frequency of 13 GHz, for example, which is also inputted to the mixer 285.

The mixer 285 produces an output signal having a frequency which is equal to the sum of the frequencies of the two input signals, namely a signal having a frequency of 14.2 GHz, as well as an output signal having a frequency which is equal the difference of the frequencies of the two input signals. The output of the mixer 285 is then filtered in filter 380 to remove one of the two output frequency components, for example, the difference frequency component is removed.

Channel 307 operates in the same fashion as channel 306. Elements 252 and 262 operate in the same fashion as the corresponding elements in FIG. 2 and filter 372 is used to select the appropriate harmonic frequency output of the comb generator 262, for example, a signal having a frequency of 15 GHz. Note that the filter 372 is labeled a tunable filter. However, the present invention is not limited thereto and the filter 372 may be a fixed filter.

The low-frequency PLL 316 may be designed to produce a signal having a frequency of 800 MHz, for example, which is inputted to the mixer 318 to produce a signal having a frequency equal to the sum of the frequencies of the two input signals, namely, a signal having a frequency output of 1.8 GHz, for example as well as a signal having a frequency equal to the difference of the frequencies of the two input signals. After being filtered by the filter 392 to remove one of the two output signal components, for example, the difference signal is removed, the resultant signal is inputted to the mixer 286 along with the signal outputted from the filter 372 to produce a signal output from the mixer 286 having a frequency equal to the sum of the frequencies of the two input signals, namely, a signal having a frequency output of 16.8 GHz as well as a signal having a frequency equal to the difference of the frequencies of the two input signals.

Note that it is possible to mix and match the channels of FIGS. 2 and 3 to fabricate a frequency source having a plurality of frequency outputs. For example, channel 205 and channel 206 of FIG. 2 may be combined with channels 306 and 307 of FIG. 3 to fabricate a frequency source.

As illustrated in the drawing figures, the RF reference signals may be produced using comb generators to generate multiple tones. Each comb generator may be driven from a common reference source to generate the coherent portions of the local oscillator signals as illustrated in FIG. 2. The comb generators generate harmonics so that the desired harmonic may be selected and filtered for each local oscillator frequency. Selecting the highest feasible frequency from each comb generator results in the greatest coherency between output local oscillator frequencies. The use of common comb generators to generate the coherent portions of the local oscillator signals is combined with low-frequency sources, such as phase-locked-loops that are easily reconfigurable to generate specific frequencies. Furthermore, easily reconfigurable filters or scalable filter designs may also be used. This modular and easily scalable design reduces the cost, schedule, and risk of developing frequency sources. The number of local oscillator frequencies may be easily increased. For example, to add an additional local oscillator output frequency, an additional module is added, the module consisting of a comb generator, a delay line, a low-frequency source and a mixer or mixers. To adapt the unit for a different system application, the number of modules can easily be changed, as is the output frequency of each of the low-frequency sources and the harmonic frequency derived from each comb generator.

This concludes the description of the example embodiments. Although the present invention has been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings, and the appended claims without departing from the spirit of the invention. In addition to variations and modifications in the component parts and/or arrangements, alternative uses will also be apparent to those skilled in the art.

What is claimed:

1. A frequency source comprising:
   a reference frequency source to generate a first signal of a specified first frequency;
   a first frequency multiplier to receive the first signal from the reference frequency source and to generate a second signal of a specified second frequency, the second frequency being an integral multiple of the first frequency; and;
   at least two channels, each channel selected from the following group of channels:
   a first channel comprising:
      a second frequency multiplier to receive the second signal from the first multiplier and to generate a third signal of a specified third frequency as an output of the frequency source, the third frequency being a harmonic of the second frequency;
   a second channel comprising:
      a frequency synthesizer to receive the first signal from the reference frequency source and to generate a fourth signal of a specified fourth frequency, the fourth frequency bearing a specific relationship to the first frequency;
      a third frequency multiplier to receive the second signal from the first frequency multiplier and to generate a fifth signal of a specified fifth frequency, the fifth frequency being a harmonic of the second frequency;
      a first mixer to receive the fourth signal from the frequency synthesizer and the fifth signal from the third frequency multiplier and to generate a sixth signal, the sixth signal including a first signal component having a frequency equal to the sum of the fourth frequency and the fifth frequency and including a second signal component having a frequency equal to the difference between the fourth frequency and the fifth frequency; and
      a first filter to receive the sixth signal from the first mixer and to output only one of the first signal component thereof and the second signal component thereof as an output of the frequency source;
   a third channel comprising:
      a second mixer to receive the fourth signal from the frequency synthesizer and the second signal from the first frequency multiplier and to generate a seventh signal, the seventh signal including a first signal component having a frequency equal to the sum of the fourth frequency and the second frequency and including a second signal component having a frequency equal to the difference between the fourth frequency and the second frequency;
      a second filter to receive the seventh signal from the second mixer and to output only one of the first signal component thereof and the second signal component thereof as an eighth signal;
      a third mixer to receive the eighth signal from the second filter and the fifth signal from the third frequency multiplier and to generate a ninth signal including a first signal component having a frequency equal to the sum of the eighth frequency and the fifth frequency and including a second signal component having a frequency equal to the difference between the eighth frequency and the fifth frequency; and
      a third filter to receive the ninth signal from the third mixer and to output only one of the first signal component thereof and the second signal component thereof as an output of the frequency source.

2. The frequency source of claim 1, wherein the first frequency multiplier comprises:
   a times N frequency multiplier to multiply a frequency of a signal inputted thereto by a multiplication factor N and to provide an output corresponding thereto, wherein N is an integer;
   a bandpass filter to receive the output of the times N frequency multiplier and to provide a band limited portion thereof as an output; and
   a PLL (Phase Locked Loop) to receive the output of the bandpass filter and to provide a signal output of a specified waveform having a frequency bearing a relationship to the frequency of the output of the times N frequency multiplier.

3. The frequency source of claim 2, wherein the second frequency multiplier comprises:
   a delay unit to receive a signal inputted thereto and to output a delayed version thereof as an output thereof;
   a comb generator to receive the output of the delay unit and to generate an output signal having a plurality of frequency components corresponding to harmonics of the signal inputted thereto; and
   a sixth filter to receive an output of the comb generator and to output a selected one of the plurality of frequency components as an output signal thereof.

4. The frequency source of claim 1, wherein the first frequency multiplier comprises:
   a fourth filter to receive a signal inputted thereto and to output a band limited portion thereof as an output thereof;
   a times N1 frequency multiplier to receive the output of the fourth filter and to multiply its frequency by a multiplication factor N1 and to provide an output corresponding thereto, wherein N1 is an integer;
   a fifth filter to receive the output of the times N1 frequency multiplier and to output a band limited portion thereof as an output thereof;
   a times N2 frequency multiplier to receive an output of the fifth filter and to multiply its frequency by multiplication factor N2 and to provide an output corresponding thereto, wherein N2 is an integer; and
   another filter to receive an output of the times N2 frequency multiplier and to provide a signal output of a specified waveform having a frequency bearing a relationship to the frequency of the output of the times N2 frequency multiplier.

5. The frequency source of claim 4, wherein the second frequency multiplier comprises:
   a delay unit to receive a signal inputted thereto and to output a delayed version thereof as an output thereof;
   a comb generator to receive the output of the delay unit and to generate an output signal having a plurality of frequency components corresponding to harmonics of the signal inputted thereto; and
   a sixth filter to receive an output of the comb generator and to output a selected one of the plurality of frequency components as an output signal thereof.

6. The frequency source of claim 1, wherein the second frequency multiplier comprises:
   a delay unit to receive a signal inputted thereto and to output a delayed version thereof as an output thereof;
   a comb generator to receive the output of the delay unit and to generate an output signal having a plurality of frequency components corresponding to harmonics of the signal inputted thereto; and a sixth filter to receive an output of the comb generator and to output a selected one of the plurality of frequency components as an output signal thereof.

7. The frequency source of claim 1, wherein the frequency synthesizer comprises:

a phase locked loop to receive a signal inputted thereto and to output a signal of a predetermined waveform of a frequency which bears a relationship to a frequency of the signal inputted thereto.

8. The frequency source of claim 1, wherein the frequency synthesizer comprises:

a second harmonic PLL to receive a signal inputted thereto and to output a signal of a frequency which bears a relationship to a frequency of the signal inputted thereto; and a seventh filter to receive the output of the second harmonic PLL and to output a band limited portion thereof as an output said thereof.

9. The frequency source of claim 1, wherein the third frequency multiplier comprises:

a delay unit to receive a signal inputted thereto and to output a delayed version thereof as an output thereof;

a comb generator to receive the output of the delay unit and to generate an output signal having a plurality of frequency components corresponding to harmonics of the signal inputted thereto; and a eighth filter to receive an output of the comb generator and to output a selected one of the plurality of frequency components as an output signal thereof.

10. A method of operating a frequency source, the method comprising:

generating a first signal of a specified first frequency with a reference frequency source;

receiving the first signal from the reference frequency source and generating a second signal of a specified second frequency with a first frequency multiplier, the second frequency being an integral multiple of the first frequency; and providing an output of the frequency source from at least two channels, each channel selected from the following group of channels:

a first channel which operates by a method comprising:
receiving the second signal from the first multiplier and generating a third signal of a specified third frequency as an output of the frequency source with a second frequency multiplier, the third frequency being a harmonic of the second frequency;

a second channel which operates by a method comprising:
receiving the first signal from the reference frequency source and generating a fourth signal of a specified fourth frequency with a frequency synthesizer, the fourth frequency bearing a specific relationship to the first frequency;
receiving the second signal from the first frequency multiplier and generating a fifth signal of a specified fifth frequency with a third frequency multiplier, the fifth frequency being a harmonic of the second frequency;
receiving the fourth signal from the frequency synthesizer and the fifth signal from the third frequency multiplier and generating a sixth signal with a first mixer, the sixth signal including a first signal component having a frequency equal to the sum of the fourth frequency and the fifth frequency and including a second signal component having a frequency equal to the difference between the fourth frequency and the fifth frequency; and
receiving the sixth signal from the first mixer and outputting only one of the first signal component thereof and the second signal component thereof as an output of the frequency source with a first filter;

a third channel which operates by a method comprising:
receiving the fourth signal from the frequency synthesizer and the second signal from the first frequency multiplier and generating a seventh signal with a second mixer, the seventh signal including a first signal component having a frequency equal to the sum of the fourth frequency and the second frequency and including a second signal component having a frequency equal to the difference between the fourth frequency and the second frequency;
receiving the seventh signal from the second mixer and outputting only one of the first signal component thereof and the second signal component thereof as an eighth signal with a second filter;
receiving the eighth signal from the second filter and the fifth signal from the third frequency multiplier and generating a ninth signal with a third mixer, the ninth signal including a first signal component having a frequency equal to the sum of the eighth frequency and the fifth frequency and including a second signal component having a frequency equal to the difference between the eighth frequency and the fifth frequency; and
receiving the ninth signal from the third mixer and outputting only one of the first signal component thereof and the second signal component thereof as an output of the frequency source with a third filter.

11. The method of operating a frequency source of claim 10, wherein the first frequency multiplier operates by a method which comprises:

multiplying a frequency of a signal inputted thereto by a multiplication factor N and providing an output corresponding thereto with a Times N frequency multiplier, wherein N is an integer;

receiving the output of the times N frequency multiplier and providing a band limited portion thereof as an output with a bandpass filter; and receiving the output of the bandpass filter and providing a signal output of a specified waveform having a frequency bearing a relationship to the frequency of the output of the times N frequency multiplier with a PLL (Phase Locked Loop).

12. The method of operating a frequency source of claim 11, wherein the second frequency multiplier operates by a method which comprises:

receiving a signal inputted thereto and outputting a delayed version thereof as an output thereof with a delay unit;

receiving the output of the delay unit and generating an output signal having a plurality of frequency components corresponding to harmonics of the signal inputted thereto with a comb generator; and receiving an output of the comb generator and outputting a selected one of the plurality of frequency components as an output signal thereof with a sixth filter.

13. The method of operating a frequency source of claim 10, wherein the first frequency multiplier operates by a method which comprises:

receiving a signal inputted thereto and outputting a band limited portion thereof as an output thereof with a fourth filter;

receiving the output of the fourth filter and multiplying its frequency by a multiplication factor N1 and providing an output corresponding thereto with a times N1 frequency multiplier, wherein N1 is an integer;

receiving the output of the times N1 frequency multiplier and outputting a band limited portion thereof as an output thereof with a fifth filter;

receiving an output of the fifth filter and multiplying its frequency by a multiplication factor N2 and providing an output corresponding thereto with a times N2 multiplier, wherein N2 is an integer; and receiving an output of the times N2 multiplier and providing a signal output of a specified waveform having a frequency bearing a relationship to the frequency of the output of the times N2 frequency multiplier with a filter.

14. The method of operating a frequency source of claim 13, wherein the second frequency multiplier operates by a method which comprises:

receiving a signal inputted thereto and outputting a delayed version thereof as an output thereof with a delay unit;

receiving the output of the delay unit and generating an output signal having a plurality of frequency components corresponding to harmonics of the signal inputted thereto with a comb generator; and receiving an output of the comb generator and outputting a selected one of the plurality of frequency components as an output signal thereof with a sixth filter.

15. The method of operating a frequency source of claim 10, wherein the second frequency multiplier operates by a method which comprises:

receiving a signal inputted thereto and outputting a delayed version thereof as an output thereof with a a delay unit;

receiving the output of the delay unit and generating an output signal having a plurality of frequency components corresponding to harmonics of the signal inputted thereto with a a comb generator; and receiving an output of the comb generator and outputting a selected one of the plurality of frequency components as an output signal thereof with an sixth filter.

16. The method of operating a frequency source of claim 10, wherein the frequency synthesizer operates by a method which comprises:

receiving a signal inputted thereto and outputting a signal of a predetermined waveform of a frequency which bears a relationship to a frequency of the signal inputted thereto with a phase locked loop.

17. The method of operating a frequency source of claim 10, wherein the frequency synthesizer operates by a method which comprises:

receiving a signal inputted thereto and outputting a signal of a frequency which bears a relationship to a frequency of the signal inputted thereto with a second harmonic PLL; and receiving the output of the second harmonic PLL and outputting a band limited portion thereof as an output said thereof with a seventh filter.

18. The method of operating a frequency source of claim 10, wherein the third frequency multiplier operates by a method which comprises:

receiving a signal inputted thereto and outputting a delayed version thereof as an output thereof with a delay unit;

receiving the output of the delay unit and generating an output signal having a plurality of frequency components corresponding to harmonics of the signal inputted thereto with a comb generator; and receiving an output of the comb generator and outputting a selected one of the plurality of frequency components as an output signal thereof with an eighth filter.

19. A method of operating a frequency source, the method comprising:

generating a first signal of a specified first frequency;

generating a second signal of a specified second frequency, the second frequency being an integral multiple of the first frequency; and providing an output of the frequency source from at least two channels, each channel selected from the following group of channels:

a first channel which operates by a method comprising generating a third signal of a specified third frequency which is a harmonic of the second frequency;

a second channel which operates by method comprising generating a fourth signal of a specified fourth frequency which is a harmonic of the second frequency and generating a fifth signal of a specified fifth frequency which bears a specific relationship to the first frequency and mixing them to produce a sixth signal of a sixth frequency corresponding to one of the sum or difference therebetween; and a third channel which operates by method comprising generating a seventh signal of a specified seventh frequency which is a harmonic of the second frequency and generating an eighth signal of a specified eighth frequency which bears a specific relationship to the first frequency and mixing the second and eighth signals to produce a ninth signal of a ninth frequency corresponding to one of the sum or difference therebetween and then mixing the seventh and ninth signals to produce a tenth signal of a tenth frequency corresponding to one of the sum or difference therebetween.

20. The method of claim 19, wherein the first channel operates by a method further comprising delaying the second signal by a predetermined period of time prior to generating the third signal.

21. The method of claim 19, wherein the second channel operates by a method further comprising delaying the second signal by a predetermined period of time prior to generating the fourth signal.

22. The method of claim 19, wherein the third channel operates by a method further comprising delaying the second signal by a predetermined period of time prior to generating the seventh signal.

23. The method of claim 19, wherein the first channel operates by a method further comprising filtering the third signal to eliminate spurious components thereof.

24. The method of claim 19, wherein the second channel operates by a method further comprising filtering the fourth signal to eliminate spurious components thereof.

25. The method of claim 19, wherein the second channel operates by a method further comprising filtering the sixth signal to eliminate spurious components thereof.

26. The method of claim 19, wherein the third channel operates by a method further comprising filtering the seventh signal to eliminate spurious components thereof.

27. The method of claim 19, wherein the third channel operates by a method further comprising filtering the ninth signal to eliminate spurious components thereof.

28. The method of claim 19, wherein the third channel operates by a method further comprising filtering the tenth signal to eliminate spurious components thereof.

29. A frequency source comprising:
a reference frequency source to generate a first signal of a specified first frequency;
a first frequency multiplier to generate a second signal of a specified second frequency which is an integral multiple of the first frequency; and
at least two channels, each channel selected from the following groups of channels:
a first channel to generate a third signal of a specified third frequency which is a harmonic of the second frequency;
a second channel to generate a fourth signal of a specified fourth frequency which is a harmonic of the second frequency and to generate a fifth signal of a specified fifth frequency which bears a specific relationship to the first frequency and to mix them to produce a sixth signal of a sixth frequency corresponding to one of the sum or difference therebetween; and
a third channel to generate a seventh signal of a specified seventh frequency which is a harmonic of the second frequency and to generate an eighth signal of a specified eighth frequency which bears a specific relationship to the first frequency and to mix the second and eighth signals to produce a ninth signal of a ninth frequency corresponding to one of the sum or difference therebetween and to then mix the seventh and ninth signals to produce a tenth signal of a tenth frequency corresponding to one of the sum or difference therebetween.

30. The frequency source of claim 29, wherein the first channel further comprises a delay means to delay the second signal by a predetermined period of time prior to generating the third signal.

31. The frequency source of claim 29, wherein the second channel further comprises a delay means to delay the second signal by a predetermined period of time prior to generating the fourth signal.

32. The frequency source of claim 29, wherein the third channel further comprises a delay means to delay the second signal by a predetermined period of time prior to generating the seventh signal.

33. The frequency source of claim 29, wherein the first channel further comprises a filter to filter the third signal to eliminate spurious components thereof.

34. The frequency source of claim 29, wherein the second channel further comprises a filter to filter the fourth signal to eliminate spurious components thereof.

35. The frequency source of claim 29, wherein the third channel further comprises a filter to filter the seventh signal to eliminate spurious components thereof.

36. The frequency source of claim 29, wherein the third channel further comprises a filter to filter the ninth signal to eliminate spurious components thereof.

37. The frequency source of claim 29, wherein the third channel further comprises a filter to filter the tenth signal to eliminate spurious components thereof.

38. A method of operating a frequency source, the method comprising:
generating a first signal of a specified first frequency; and
providing an output of the frequency source from at least two channels, each channel selected from the following group of channels:
a first channel which operates by a method comprising generating a second signal of a specified second frequency which is a harmonic of the first frequency;
a second channel which operates by method comprising generating a third signal of a specified third frequency which is a harmonic of the first frequency and generating a fourth signal of a specified fourth frequency which bears a specific relationship to the first frequency and mixing them to produce a fifth signal of a fifth frequency corresponding to one of the sum or difference therebetween; and
a third channel which operates by method comprising generating a sixth signal of a specified sixth frequency which is a harmonic of the first frequency and generating an seventh signal of a specified seventh frequency which bears a specific relationship to the first frequency and mixing the first and seventh signals to produce an eighth signal of an eighth frequency corresponding to one of the sum or difference therebetween and then mixing the sixth and eighth signals to produce a ninth signal of a ninth frequency corresponding to one of the sum or difference therebetween.

39. The method of claim 38, wherein the first channel operates by a method further comprising delaying the first signal by a predetermined period of time prior to generating the second signal.

40. The method of claim 38, wherein the second channel operates by a method further comprising delaying the first signal by a predetermined period of time prior to generating the third signal.

41. The method of claim 38, wherein the third channel operates by a method further comprising delaying the first signal by a predetermined period of time prior to generating the sixth signal.

42. The method of claim 38, wherein at least one of the first, second, and third channels operates by a method further comprising providing filtering to eliminate spurious signal components.

43. A frequency source comprising:
a reference frequency source to generate a first signal of a specified first frequency; and
at least two channels, each channel selected from the following groups of channels:
a first channel to generate a second signal of a specified second frequency which is a harmonic of the first frequency;
a second channel to generate a third signal of a specified third frequency which is a harmonic of the second frequency and to generate a fourth signal of a specified fourth frequency which bears a specific relationship to the first frequency and to mix them to produce a fifth signal of a fifth frequency corresponding to one of the sum or difference therebetween; and
a third channel to generate a sixth signal of a specified sixth frequency which is a harmonic of the first frequency and to generate a seventh signal of a specified seventh frequency which bears a specific relationship to the first frequency and to mix the first and seventh signals to produce an eighth signal of an eighth frequency corresponding to one of the sum or difference therebetween and to then mix the sixth and eighth signals to produce a ninth signal of a ninth frequency corresponding to one of the sum or difference therebetween.

44. The frequency source of claim 43, wherein the first channel further comprises a delay means to delay the first signal by a predetermined period of time prior to generating the second signal.

45. The frequency source of claim 43, wherein the second channel further comprises a delay means to delay the first signal by a predetermined period of time prior to generating the third signal.

46. The frequency source of claim 43, wherein the third channel further comprises a delay means to delay the first signal by a predetermined period of time prior to generating the sixth signal.

47. The frequency source of claim 43, wherein at least one of the first, second, and third channels further comprises a filter to eliminate spurious signal components.

* * * * *